United States Patent [19]
Wise

[11] Patent Number: 5,915,175
[45] Date of Patent: Jun. 22, 1999

[54] MITIGATION OF CMP-INDUCED BPSG SURFACE DAMAGE BY AN INTEGRATED ANNEAL AND SILICON DIOXIDE DEPOSITION

[75] Inventor: Michael L. Wise, Poughkeepsie, N.Y.

[73] Assignee: Siemens Aktiengesellschaft, Munich, Germany

[21] Appl. No.: 08/884,119

[22] Filed: Jun. 27, 1997

[51] Int. Cl.[6] .............................................. H01L 21/8234
[52] U.S. Cl. .......................................... 438/238; 438/759
[58] Field of Search ................................... 438/238, 239, 438/691, 759, 760, 783

[56] References Cited

U.S. PATENT DOCUMENTS 5,395,801   3/1995   Doan et al. ............................. 437/225
5,688,720  11/1997   Hayashi ................................. 437/195

Primary Examiner—Joni Chang
Attorney, Agent, or Firm—Stanton C. Braden

[57] ABSTRACT

Healing of scratches created during CMP is achieved by reflowing the material containing the scratches and then depositing a top layer of material. The deposition of the top layer further enhances the healing of the scratches.

18 Claims, 3 Drawing Sheets

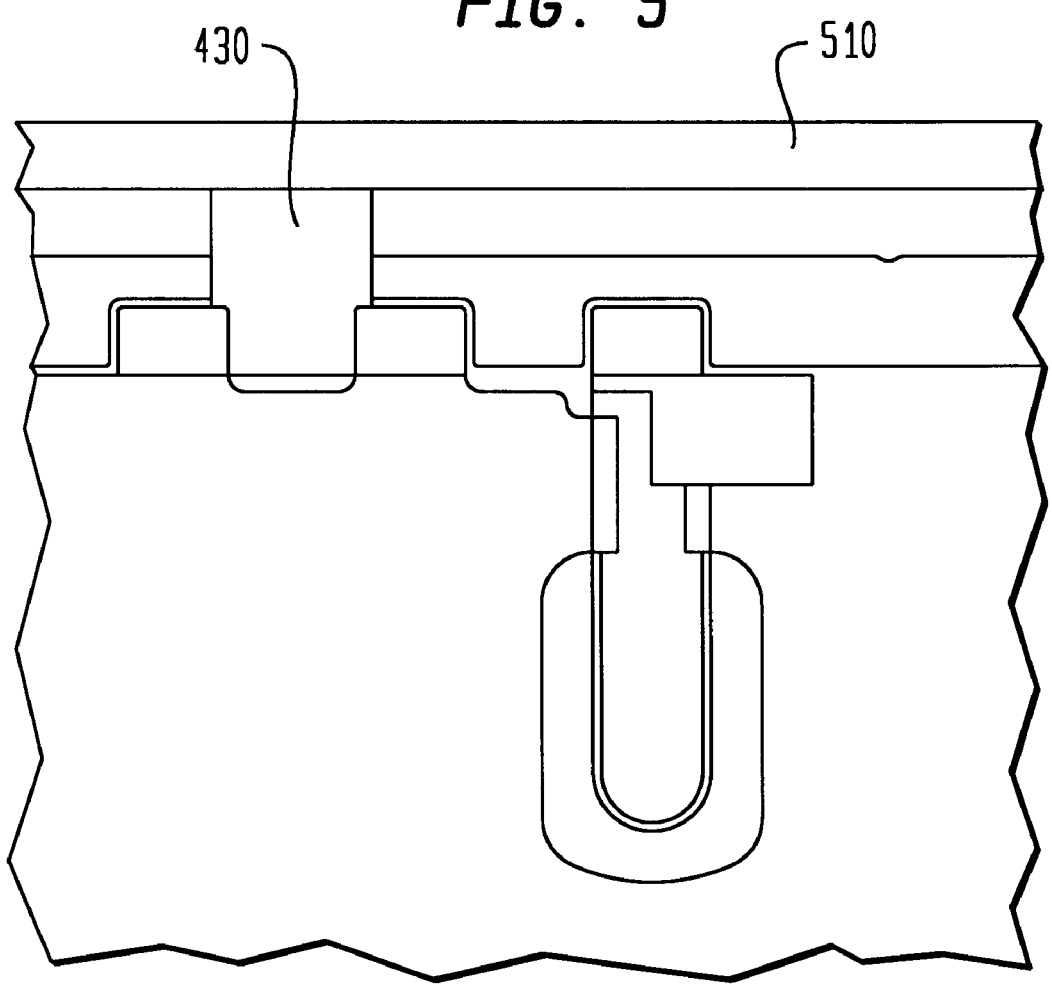

MITIGATION OF CMP-INDUCED BPSG SURFACE DAMAGE BY AN INTEGRATED ANNEAL AND SILICON DIOXIDE DEPOSITION

BACKGROUND OF THE INVENTION

1. Technical Field

The present invention relates to device fabrication and, more particularly, to removal of scratches created during polishing.

2. Background Art

In device fabrication, insulating, semiconducting, and conducting layers are formed on a substrate or wafer. The layers are patterned to create features and spaces, forming devices, such as transistors, capacitors, and resistors. These devices are then interconnected to achieve a desired electrical function.

It is often desirable to provide a planar topography before a subsequent layer is formed. A nonplanar topography creates problems in the patterning of subsequent layers. Such problems include, for example, limited depth of focus by the photolithographic system, metal residues during reactive ion etching, and poor metal step coverage.

To provide a planar topography, planarization schemes are employed. The planarization schemes typically include polishing to remove topography, surface defects such as crystal lattice damage, scratches, roughness or embedded articles such as dirt or dust. This polishing is typically referred to as chemical mechanical polishing (CMP).

In general, the CMP process involves holding a thin flat wafer against a rotating wetted polishing surface under a controlled downward pressure. A polishing slurry such as a solution of alumina or silica may be used as the abrasive medium. A rotating polishing head or wafer carrier is typically utilized to hold the wafer under controlled pressure against a rotating polishing platen. The polishing platen is typically covered with a relatively soft wetted pad material such as a blown polyurethane.

However, CMP creates micro scratches on the surface of the layer being polished. These micro scratches are particularly problematic in interconnection schemes. For example, the scratches formed during CMP are filled with metal as the metal layer is deposited. As dimensions of feature size becomes increasingly smaller, there is a greater probability that a scratch contacting adjacent metal lines exist. The metal trapped in such a scratch creates a short between the adjacent metal lines with which it is in contact, thus rendering the device defective.

Conventionally, a touch-up CMP is employed to combat the problem of shorts caused by metal filled scratches created during CMP. Although the touch-up CMP has been effective in reducing scratches, it requires careful monitoring to prevent overpolishing. Furthermore, the additional touch-up CMP is time consuming, adding to the raw process time in producing the device.

Therefore, there exist a need to provide a planar topography without scratches efficiently and easily.

SUMMARY OF THE INVENTION

The present invention provides a process of manufacturing an integrated circuit chip using a reflow step to the oxide in order to remove scratches. Once the oxide has been subjected to the CMP process, the scratches may be removed by reflow. If BPSG is used as the interlevel dielectric, it may be reflowed at temperatures as low as 750° Celsius (C.).

Subsequently, a dielectric layer is formed over the oxide. The dielectric layer can be of the same material as the oxide or different. The dielectric layer further heals the scratches formed during CMP.

BRIEF DESCRIPTION OF THE DRAWINGS

The preferred exemplary embodiment of the present invention will hereinafter be described in conjunction with the appended drawings, wherein like designations denote like elements, and:

FIG. 5 is a graphical depiction of the improved yield obtained by utilizing the process of the present invention.

DETAILED DESCRIPTION OF THE EMBODIMENT

The invention generally relates to device fabrication and particular to removing scratches formed during polishing. To facilitate discussion, the invention is described in the context of forming interlevel dielectric layer. However, the invention is broader and is applicable to removing scratches formed during polishing in general.

Figure 1:
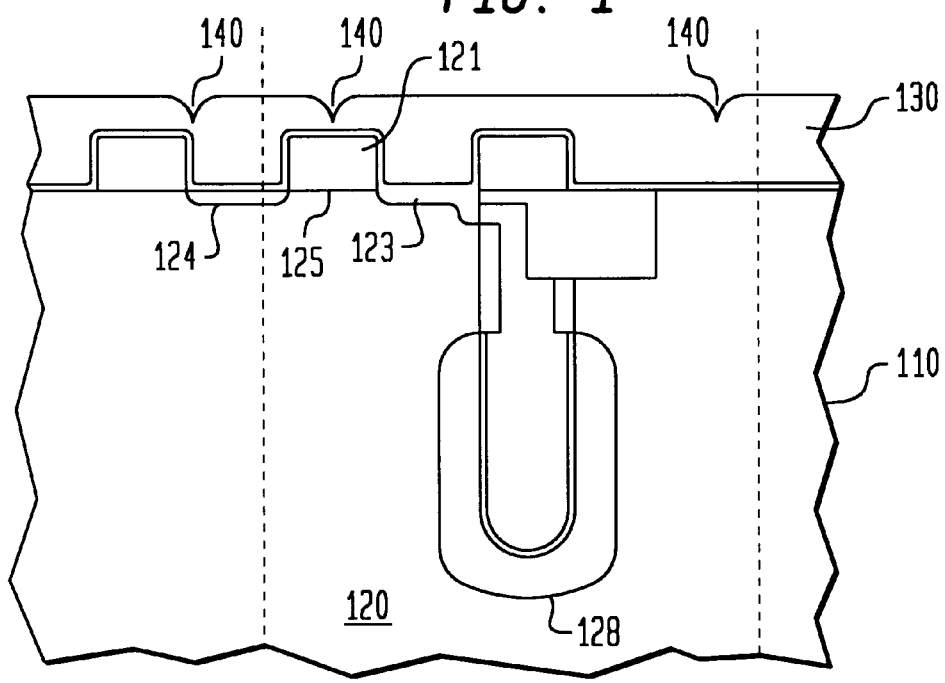
FIGS. 1–2 are schematics depicting the step-wise formation of a scratch and the resulting electrical short.

Referring to FIG. 1, a semiconductor substrate 110 is shown. The substrate, for example, comprises a silicon wafer. Other semiconductor substrate, such as germanium, galium arsenide, or silicon on insulator (SOI) is also useful. The substrate comprises circuit features formed in or on the surface thereof. As shown, the circuit features include a memory cell 120 (depicted between the dotted lines) such as a random access memory (DRAM) cell. The memory cell includes a transistor 121 electrically connected to a capacitor 128. As shown, the capacitor is a trench capacitor. Such memory cell is described in, for example, Wolf, *Silicon Processing for the VLSI Eru, Vol. 2-Process Integration*, Lattice Press (1990), which is herein incorporated by reference for all purposes. A plurality of such memory cells and additional support circuitry comprise a DRAM integrated circuit or chip.

The transistor includes a drain 123, source 124, and gate 125. The gate represents a wordline and the source represents a bitline in a DRAM chip. Transistors of other DRAM cell in the DRAM chip are also depicted.

An interlevel dielectric layer 130 is formed on the surface of the substrate which includes having a topography created by the circuit features. The dielectric layer comprises a reflowable dielectric material. The flowable material includes, for example, doped silicate glass such as borophosphosilicate glass (BPSG), arsenic doped glass (ASG), borosilicate glass (BSG), or phosphosilicate glass (PSG). Other flowable material that serves as an interlevel dielectric layer is also useful.

In one embodiment, the interlevel dielectric layer is BPSG. Due to BPSG good gap filling characteristics, it is particularly useful in filling high aspect ratio features. The BPSG is deposited by, for example, chemical vapor deposition(CVD), including atmospheric pressure CVD, plasma-enhanced CVD, and low pressure CVD. In one embodiment, the BPSG layer is deposited by low pressure CVD (LPCVD). Typically, LPCVD of BPSG includes injecting chemistries such as TEOS, a boron compound such as diborane, and a phosphorous compound such as phosphine into a CVD reactor. Other silicon, oxygen, boron, and phosphorous precursors are also useful. The deposition temperature is, for example, about 650°–850° C. with pressures of about 0.25–2 Torr. The BPSG is reflowed after filling the gaps between the features.

The reflow does not result in a sufficiently planar BPSG, thus requiring a CMP to planarize the surface. The deposited BPSG layer is sufficiently thick to fill the gaps and allow for planarization. The CMP results in a planar BPSG layer having a thickness that is less than a predetermined desired thickness. As such, it is preferable to deposit the BPSG as thin as possible since less material is needed to be removed during planarization. The predetermined desired thickness depends on various factors such as isolation and performance requirements. As previously discussed, the CMP creates micro scratches 140 on the surface of the BPSG layer.

Figure 2:
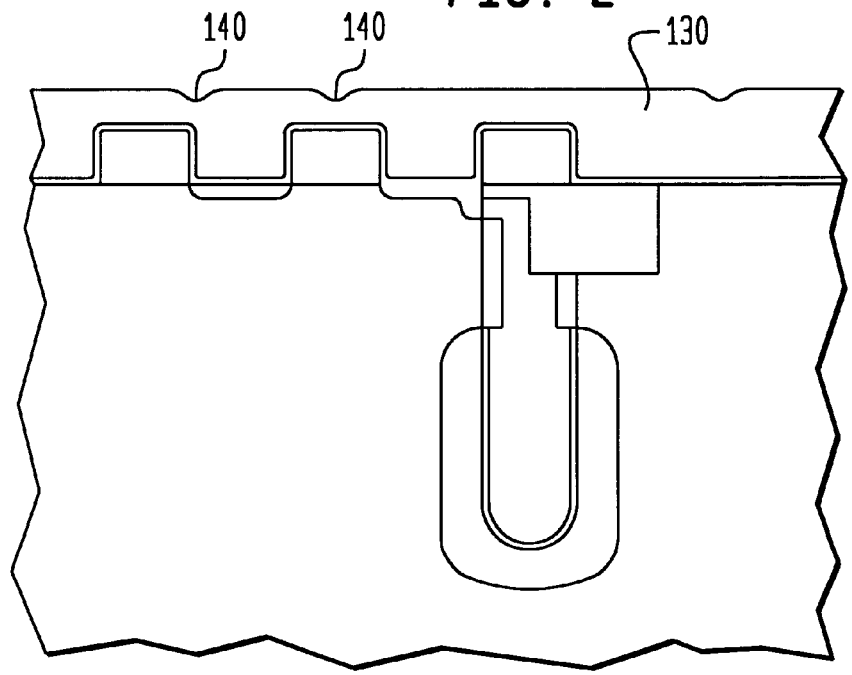

Referring to FIG. 2, the BPSG layer is heated to a temperature sufficiently to cause it to reflow. In one embodiment, the BPSG is annealed at a temperature from about 750–1100° C. Typically higher temperatures and/or longer anneal times improve healing characteristics. Of course, the temperature and duration are optimized depending on the actual thermal budget available. The annealing is performed in, for example, an inert ambient, such as $N_2$, $O_2$ or $H_2O$. The annealing causes the BPSG to become viscous and respond to surface tension forces, causing it to flow. As a result, the scratches 140 created during CMP become partially or fully healed.

Figure 3:
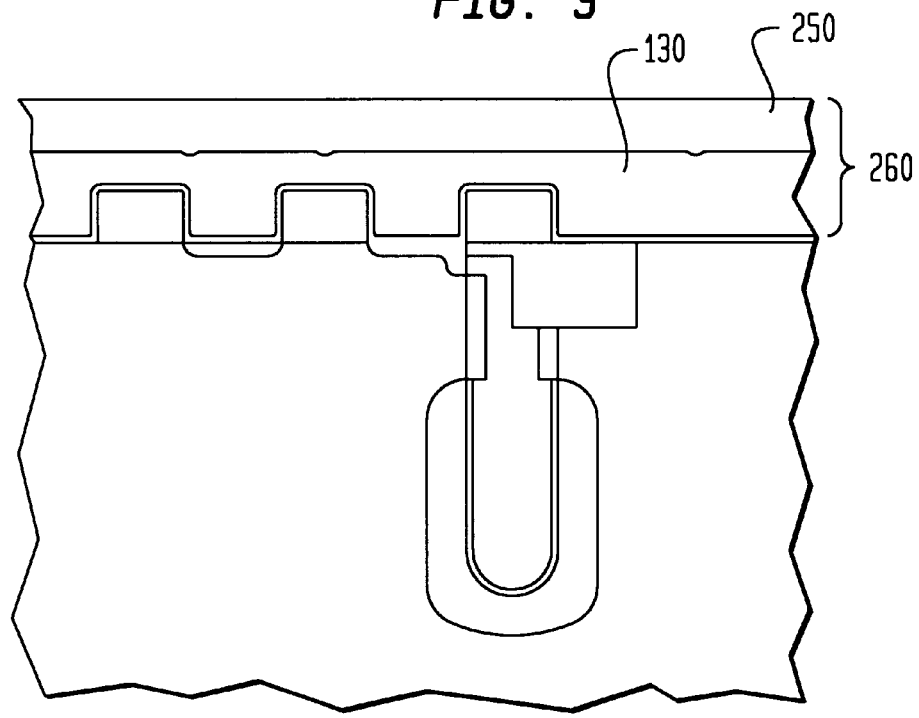
FIGS. 3–4 are schematics depicting the step-wise formation of a scratch, removal of the scratch by the process of the present invention and the integrated circuit chip formed thereby.

Referring to FIG. 3, a dielectric layer 250 is formed on the surface of reflowed dielectric layer. Both the dielectric layer and reflowed dielectric layer become the interlevel dielectric layer 260. The combined thickness of the dielectric layers is equal to or greater than the predetermined thickness of the interlevel dielectric layer. Preferably, the combined thickness is equal to about the predetermined thickness. As discussed the predetermined thickness depends on design requirements.

Deposition of the dielectric layer 250 is advantageous in that any lateral growth component in this deposition further mitigates scratches that remain in the reflowed dielectric layer. The lateral growth component can be a result of the shape of the scratch topography and/or by deposition which is isotropic in nature. For example, in an isotropic type deposition, the sidewalls in the new dielectric layer that result from topography in the reflowed layer grow together, thereby reducing the width and depth of the existing scratch. As a result topography created by the scratch is either removed or significantly reduced in the top dielectric layer.

The dielectric layer 250 comprises, for example, doped silicate glass. The doped silicate glass is deposited by various CVD techniques. The doped silicate glass can be the same as the reflowed dielectric layer to form a homogeneous dielectric layer 260. Other doped silicate glass that results in a nonhomogenous dielectric layer 260 is also useful. In one embodiment, the dielectric layer 250 comprises BPSG to result in a homogenous BPSG interlevel dielectric layer 260. BPSG or doped silicate glass is advantageous in that it enhances the healing of the scratches due to its better gap fill properties. Additionally, doped silicate glass can further be reflowed. In particular, BPSG can be reflowed at a lower temperature.

Alternatively, the dielectric layer 250 comprises undoped silicate glass, such as silicon oxide ($SiO_2$). Other undoped dielectric materials are also useful. The undoped dielectric advantageously serves as a diffusion barrier between the doped dielectric layer and subsequent layers.

The formation of the dielectric layer and the reflow anneal can be advantageously conducted in the same tool, such as a chemical vapor deposition (CVD) tool. For example, the deposition of the dielectric material can be achieved by changing the ambient gases in the reactor from the reflow ambient to the dielectric deposition processors, such as TEOS (tetraethoxysilane) for the $SiO_2$ film.

Figure 4:
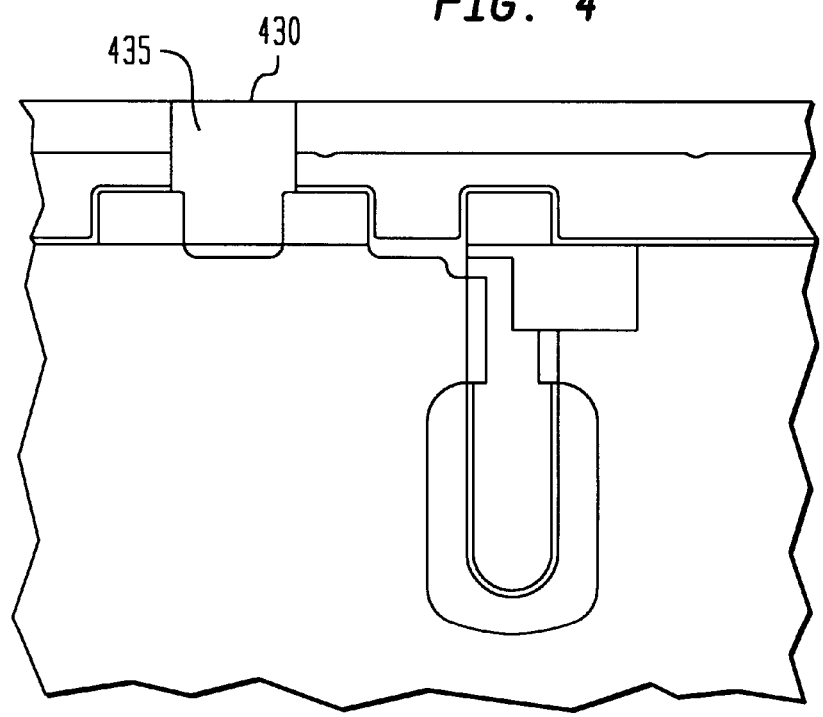

In FIG. 4, the interlevel dielectric layer is patterned to create the desired interconnections with a subsequently formed metal layer. As shown, an opening 430 such as a boarderless contact is formed in the dielectric layer. The contact is, for example, the bitline contact to the DRAM cell. Although only one contact is shown, the DRAM array includes other bitline contact openings. Additionally, trenches, vias, areas, or openings are provided where metallization and interconnection are desired.

The opening patterns are formed by, for example, applying a photoresist layer over the dielectric layer. The resist layer is selectively exposed by an exposure source using a mask containing a pattern corresponding to the trenches and vias. Depending on whether a positive or negative resist is used, the exposed or unexposed portions are removed. An RIE is performed, removing the interlevel dielectric layer in areas unprotected by the resist to form trenches and vias. After removal of the remaining resist, a conductive material, such as doped polysilicon (poly) for use as a poly stud, is formed. In one embodiment poly is used to fill the bitline opening. The conductive material sufficiently covers the opening. The excess poly is removed, resulting in a poly stud 435.

Referring to FIG. 5, a metal layer 510 is formed over the surface of the dielectric layer. This layer is patterned to form a plurality of lines, representing the bitlines of the DRAM array. The poly stud 435 contacts one of the bitlines. Other poly studs (not shown) contact the appropriate bitlines. Additional interlevel dielectric and conductive layers are formed and patterned to form, for example, wordlines and other interconnections to result in the DRAM chip.

Since the scratches formed during CMP are removed or reduced in size, the probability of a short forming between, for example, adjacent bitlines is reduced. Therefore, manufacturing yield is increased.

This invention has been described in terms of specific embodiments, set forth in detail. It should be understood, however, that these embodiments are presented by way of illustration only, and that the invention is not necessarily limited thereto. Modifications and variations within the spirit and scope of the claims that follow will be readily apparent from this disclosure, as those skilled in the art will appreciate.

What is claimed is:

1. A method for forming a semiconductor device including the process for healing scratches formed during polishing comprising:

depositing a flowable dielectric layer over the device;

polishing the flowable dielectric layer by CMP to create a planar surface;

heating the device to a temperature sufficient to cause the flowable dielectric layer to become viscous whereby the flowable dielectric layer responds to surface tension and flows to at least partially heal the scratches formed during CMP; and forming a dielectric layer above the flowable dielectric material, the thickness of the combined flowable dielectric layer and the dielectric layer being equal to about a predetermined thickness.

2. A method for forming a semiconductor device including the process for healing scratches formed during polishing comprising:

forming device features on a substrate;

depositing a flowable dielectric layer on the substrate, the flowable dielectric layer covering the device features and substrate;

polishing the flowable dielectric layer by CMP to produce a planar surface;

heating the flowable dielectric layer to a temperature sufficient to cause the flowable dielectric layer to become viscous whereby the flowable dielectric layer responds to surface tension and flows to at least partially heal the scratches formed during CMP;

forming a dielectric layer above the flowable dielectric layer, the thickness of the combined flowable dielectric layer and the dielectric layer is equal to about a predetermined thickness; and combining the dielectric layer and the flowable dielectric layer to form an interlevel dielectric layer.

3. A method for reducing surface non-uniformities during semiconductor processing comprising:

providing a semiconductor device having a flowable dielectric layer thereon;

polishing the flowable dielectric layer to create a substantially planar surface thereon;

annealing the substantially planar surface to reduce the non-uniformities created by polishing; and depositing a layer of dielectric over the flowable dielectric layer to form a surface with further reduced the non-uniformities on the dielectric layer.

4. A method for reducing surface non-uniformities as recited in claim 3 wherein the flowable dielectric layer is BPSG.

5. A method for reducing surface non-uniformities as recited in claim 3 wherein the flowable dielectric layer is ASG.

6. A method for reducing surface non-uniformities as recited in claim 3 wherein the flowable dielectric layer is BSG.

7. A method for reducing surface non-uniformities as recited in claim 3 wherein the flowable dielectric layer is PSG.

8. A method for reducing surface non-uniformities as recited in claim 3 wherein the step of polishing is performed by CMP.

9. A method for reducing surface non-uniformities as recited in claim 3 further comprises the step of providing an interlevel dielectric layer on the semiconductor device, the interlevel dielectric layer including the dielectric layer and the flowable dielectric layer.

10. A method for reducing surface non-uniformities as recited in claim 3 wherein the dielectric layer and the flowable dielectric layer are made of the same material.

11. A method for reducing surface non-uniformities as recited in claim 10 wherein the flowable dielectric layer and the dielectric layer are made of BPSG.

12. A method for reducing surface non-uniformities as recited in claim 3 wherein the dielectric layer is made from an oxide.

13. A method of forming a random access memory chip as recited in claim 1 wherein the flowable dielectric layer is BPSG.

14. A method of forming a random access memory chip as recited in claim 1 wherein the dielectric layer and the flowable dielectric layer are made of the same material.

15. A method of forming a random access memory chip as recited in claim 1 wherein the dielectric layer is silicon dioxide.

16. A method for forming a semiconductor device as recited in claim 2 wherein the flowable dielectric layer is BPSG.

17. A method for forming a semiconductor device as recited in claim 2 wherein the dielectric layer and the flowable dielectric layer are made of the same material.

18. A method for forming a semiconductor device as recited in claim 2 wherein the dielectric layer is silicon dioxide.

* * * * *